United States Patent
Chien et al.

(10) Patent No.: US 8,983,020 B2
(45) Date of Patent: Mar. 17, 2015

(54) SHIFT REGISTER CIRCUIT AND DRIVING METHOD THEREOF

(71) Applicant: AU Optronics Corp., Hsin-Chu (TW)

(72) Inventors: Ling-Ying Chien, Hsin-Chu (TW); Kuang-Hsiang Liu, Hsin-Chu (TW); Yu-Hsin Ting, Hsin-Chu (TW)

(73) Assignee: AU Optronics Corp., Hsin-chu (TW)

( * ) Notice: Subject to any disclaimer, the term of this patent is extended or adjusted under 35 U.S.C. 154(b) by 80 days.

(21) Appl. No.: 13/897,506

(22) Filed: May 20, 2013

(65) Prior Publication Data

US 2014/0062847 A1 Mar. 6, 2014

(30) Foreign Application Priority Data

Sep. 4, 2012 (TW) .............................. 101132217 A (51) Int. Cl.
*G11C 19/00* (2006.01)
*G09G 3/36* (2006.01)

(52) U.S. Cl.
CPC ............ *G09G 3/3674* (2013.01); *G09G 3/3677* (2013.01); *G09G 2310/0286* (2013.01); *G09G 2320/0209* (2013.01); *G09G 2320/0233* (2013.01)
USPC .................................. 377/64; 377/78; 377/79

(58) Field of Classification Search
None
See application file for complete search history.

(56) References Cited

U.S. PATENT DOCUMENTS

| | | | | |
|---|---|---|---|---|
| 7,697,655 B2 * | 4/2010 | Chan et al. | ....................... | 377/64 |
| 8,041,000 B2 * | 10/2011 | Moon et al. | ..................... | 377/64 |
| 8,102,962 B2 * | 1/2012 | Liu et al. | ......................... | 377/64 |
| 8,290,115 B2 * | 10/2012 | Kim et al. | ....................... | 377/68 |
| 8,411,017 B2 * | 4/2013 | Hsu et al. | ....................... | 345/100 |
| 8,643,584 B2 * | 2/2014 | Han et al. | ....................... | 345/100 |
| 2004/0109526 A1 * | 6/2004 | Park et al. | ........................ | 377/64 |
| 2010/0067646 A1 * | 3/2010 | Liu et al. | ........................ | 377/69 |
| 2012/0092311 A1 * | 4/2012 | Ohkawa et al. | ............... | 345/204 |
| 2012/0320021 A1 | 12/2012 | Chang et al. | | |
| 2013/0135284 A1 * | 5/2013 | Tseng et al. | .................. | 345/212 |
| 2013/0173870 A1 * | 7/2013 | Tseng et al. | .................. | 711/154 |

* cited by examiner

*Primary Examiner* — Tuan T Lam
(74) *Attorney, Agent, or Firm* — WPAT, PC; Justin King (57) ABSTRACT

A shift register circuit includes a first shift register string and a second shift register string. The first shift register string is configured to receive a first start signal and output a first-stage control signal. The second shift register string, electrically connected to the first shift register string, is configured to receive the first-stage control signal and a second start signal and output the first pulse of a first-stage scan signal according to the first-stage control signal and the second start signal and consequently output the second pulse of the first-stage scan signal according to the second start signal; wherein the first and second pulses are configured to have different pulse widths. A driving method of a shift register circuit is also provided.

20 Claims, 11 Drawing Sheets

SHIFT REGISTER CIRCUIT AND DRIVING METHOD THEREOF

TECHNICAL FIELD

The present disclosure relates to a display technical field, and more particularly to a shift register circuit and a driving method thereof.

BACKGROUND

To reduce the need of a large number of driver integrated chip (IC) and thereby meeting the compact design requirement, some liquid crystal display (LCD) manufacturers use the gate driver on array (GOA) technology to manufacture the shift register in the LCD manufacture process.

With the increasing of display resolution, the distance between each two pixels in an LCD is getting smaller and smaller and consequently the interaction between the pixels is getting more and more serious. One of the interaction issues is: the pixels being charged (or, updated) may result in a pixel charge coupling effect on those pixels already have been charged (or, updated), and thereby leading to an abnormal display image, such as low brightness uniformity.

In today's pixel array structure of LCD panel, the half source driving (HSD) structure is able to reduce the cost of source drivers by doubling the number of scan line but cutting half the number of data line. However, if the HSD structure is employed on the gate drive circuit board (regardless the GOA structure or the IC packaging structure), the aforementioned pixel voltage coupling effect still occurs and the abnormal display image issue may get worst.

SUMMARY

An embodiment of the disclosure is to provide a shift register circuit, which includes a first shift register string and a second shift register string. The first shift register string is configured to receive a first start signal and output a first-stage control signal. The second shift register string, electrically connected to the first shift register string, is configured to receive the first-stage control signal and a second start signal and output the first pulse of a first-stage scan signal according to the first-stage control signal and the second start signal and consequently output the second pulse of the first-stage scan signal according to the second start signal; wherein the first and second pulses are configured to have different pulse widths.

Another embodiment of the disclosure is to provide a driving method of a shift register circuit. The shift register circuit includes a first shift register string and a second shift register string. The driving method includes: providing a first start signal to the first shift register string and thereby configuring the first shift register string to output a first-stage control signal; and providing the first-stage control signal and a second start signal to the second shift register string and thereby configuring the second shift register string to output the first pulse of a first-stage scan signal according to the first-stage control signal and the second start signal and consequently output the second pulse of the first-stage scan signal according to the second start signal, wherein the first and second pulses are configured to have different pulse widths.

Still another embodiment of the disclosure is to provide a shift register circuit, which includes a shift register string. The shift register string includes a first pull-down unit and a second pull-down unit. The shift register string is configured to receive a control signal and a start signal and output the first pulse of a first-stage scan signal according to the control signal and the start signal and consequently output the second pulse of the first-stage scan signal according to the start signal, wherein the first and second pulses are configured to have different pulse widths.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
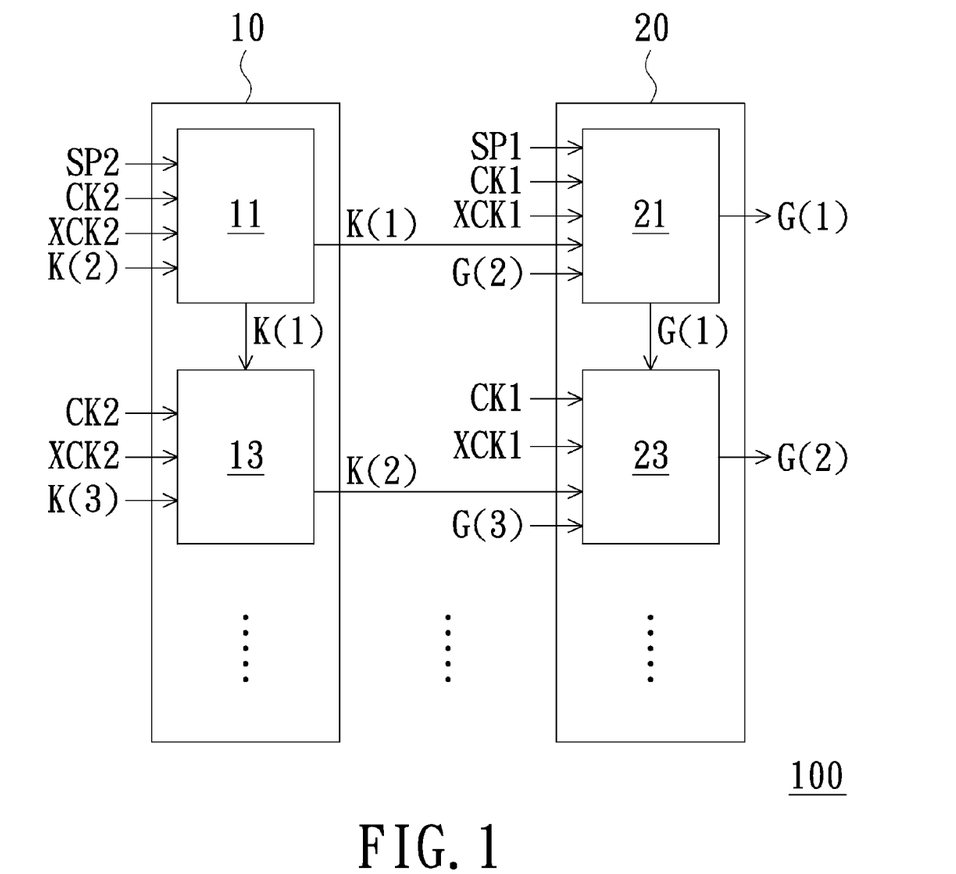
FIG. 1 is a schematic view of a shift register circuit in accordance with an embodiment of the present disclosure.

FIG. 1 is a schematic view of a shift register circuit in accordance with an embodiment of the present disclosure. As shown, the shift register circuit 100 in this embodiment includes a first shift register string 10 and a second shift register string 20.

The first shift register string 10 includes a plurality of stages of first shift register, such as the first stage of first shift register 11, the second stage of first shift register 13, and so on. The first stage of first shift register 11 is configured to receive a start signal SP2, a clock signal CK2, a complementary clock signal XCK2, a second-stage control signal K(2) and accordingly output a first-stage control signal K(1) to the second stage of first shift register 13. The second stage of first shift register 13 is configured to the receive first-stage control signal K(1), the clock signal CK2, the complementary clock signal XCK2, a third-stage control signal K(3) and accordingly output a second-stage control signal K(2). In addition, it is understood that the rest first shift registers in the first shift register string 10 each have the signal connection similar to that of the first stage of first shift register 11 and the second stage of first shift register 13.

The second shift register string 20 includes a plurality of stages of second shift register, such as the first stage of second shift register 21, the second stage of second shift register 23, and so on. The first stage of second shift register 21 is configured to receive a start signal SP1, a clock signal CK1, a complementary clock signal XCK1, the first-stage control signal K(1) from the first stage of first shift register 11, a second-stage scan signal G(2) and accordingly output a first-stage scan signal G(1). The second stage of second shift register 23 is configured to the receive first-stage scan signal G(1), the clock signal CK1, the complementary clock signal XCK1, the second-stage control signal K(2) from the second stage of first shift register 13, a third-stage scan signal G(3) and accordingly output the second-stage scan signals G(2). In addition, it is understood that the rest second shift registers in the second shift register string 20 each have the signal connection similar to that of the first stage of second shift register 21 and the second stage of second shift register 23.

Figure 2:
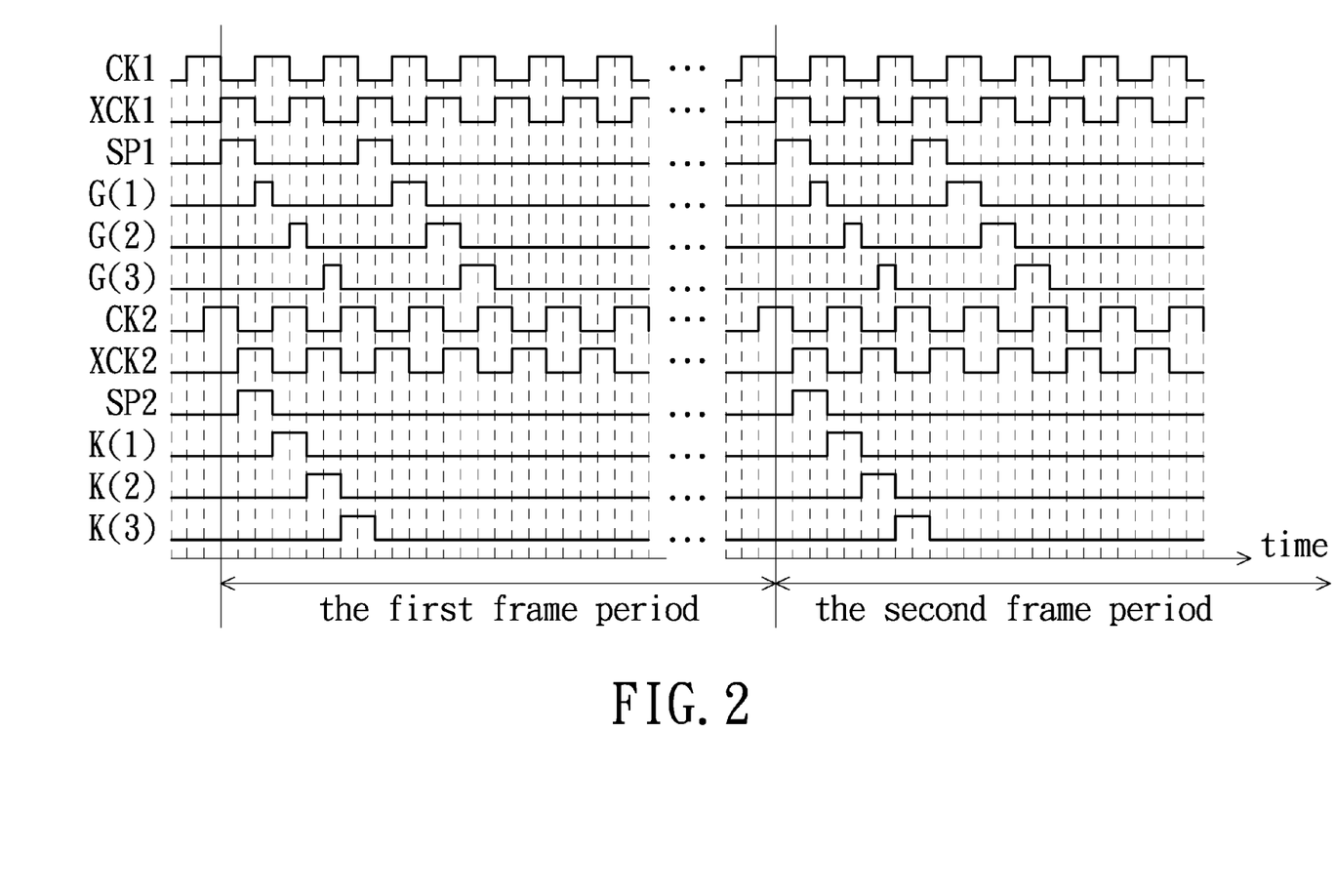
FIG. 2 is a schematic waveform view of the signals associated with the shift register circuit shown in FIG. 1.

FIG. 2 is a schematic waveform view of the signals associated with the shift register circuit 100 shown in FIG. 1; wherein each two adjacent dotted lines presents the same time length. Please refer to FIGS. 1, 2 both. The start signal SP2 is configured to provide one pulse to the first stage of first shift register 11 in one frame period; and accordingly the first stage of first shift register 11 is configured to, in response to the receiving of the pulse of the start signal SP2, output the first-stage control signal K(1) to both of the first stage of second shift register 21 and the second stage of first shift register 13 according to the clock signal CK2, the complementary clock signal XCK2 and the second-stage control signal K(2).

In addition, the start signal SP1 is configured to provide two pulses to the first stage of second shift register 21 in one frame period; and accordingly the first stage of second shift register 21 is configured to, in response to the receiving of the two pulses of the start signal SP1, output the first-stage scan signal G(1) according to the clock signal CK1, the complementary clock signal XCK1, the first-stage control signal K(1) and the second-stage scan signals G(2).

Specifically, the first stage of second shift register 21 is configured to output the first pulse of the first-stage scan signal G(1) according to the first-stage control signal K(1) and the start signal SP1 and then output the second pulse of the first-stage scan signal G(1) according to the start signal SP1. The first and second pulses of the first-stage scan signal G(1) are configured to have different pulse widths; in this embodiment, the first pulse is configured to have a pulse width half to that of the second pulse. Specifically, in this embodiment, the generation of the first pulse of the first-stage scan signal G(1) according to the first-stage control signal K(1) is realized by configuring the first-stage control signal K(1) to turn on both of the first pull-down unit 25 (shown in FIG. 3B) and the second pull-down unit 27 (shown in FIG. 3B). Therefore, by using the first pulse of the first-stage scan signal G(1) to perform the pre-charging operation on the electrically-connected pixels in advance, these electrically-connected pixels can have a narrowed down potential difference while being charged by the second pulse of the first-stage scan signal G(1). Thus, the voltage coupling effect on the potential of the pixels already have been charged is reduced; and consequently the unusual displaying issue can be avoided in this embodiment.

For example, in one frame period, because the pixels electrically connected to the second-stage scan signal G(2) are performed the pre-charging operation by the first pulse thereof in advance, these electrically-connected pixels can have a narrowed down potential variation while being updated by the second pulse of the second-stage scan signal G(2). Thus, the voltage coupling effect, resulted via the stray capacitors and on the pixels electrically connected to the first-stage scan signal G(1) and have been updated in this frame period, is reduced and consequently the abnormal display image (such as low brightness uniformity) occurring in the prior art can be avoided.

Please refer back to FIG. 2, again. As shown, in one frame period the start signal SP2 is configured to have the pulse thereof lagging behind the first pulse of the start signal SP1. Specifically, in this embodiment the start signals SP1 and SP2 are configured to have the same pulse width, and the start signal SP2 is configured to have the pulse thereof lagging behind the first pulse of the start signal SP1 by, for example, a half pulse width. In addition, the first-stage scan signal G(1) is configured to have the first pulse thereof leading ahead of the first pulse of the second-stage scan signal G(2); the second-stage scan signal G(2) is configured to have the first pulse thereof leading ahead of the first pulse of the third-stage scan signal G(3); the first-stage scan signal G(1) is configured to have the second pulse thereof leading ahead of the second pulse of the second-stage scan signal G(2); the second-stage scan signal G(2) is configured to have the second pulse thereof leading ahead of the second pulse of the third-stage scan signal G(3).

Figure 3A:
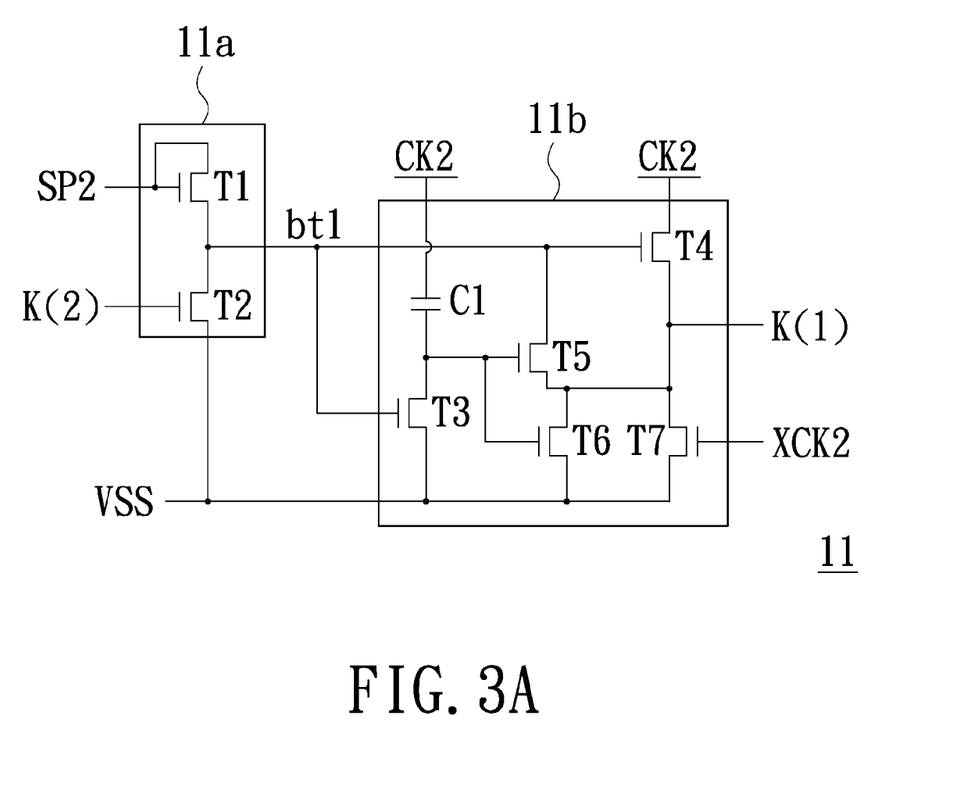
FIGS. 3A, 3B are schematic in-detailed circuit views of the first stage of first shift register and the first stage of second shift register shown in FIG. 1 in accordance with a first embodiment of the present disclosure, respectively.
Figure 3B:
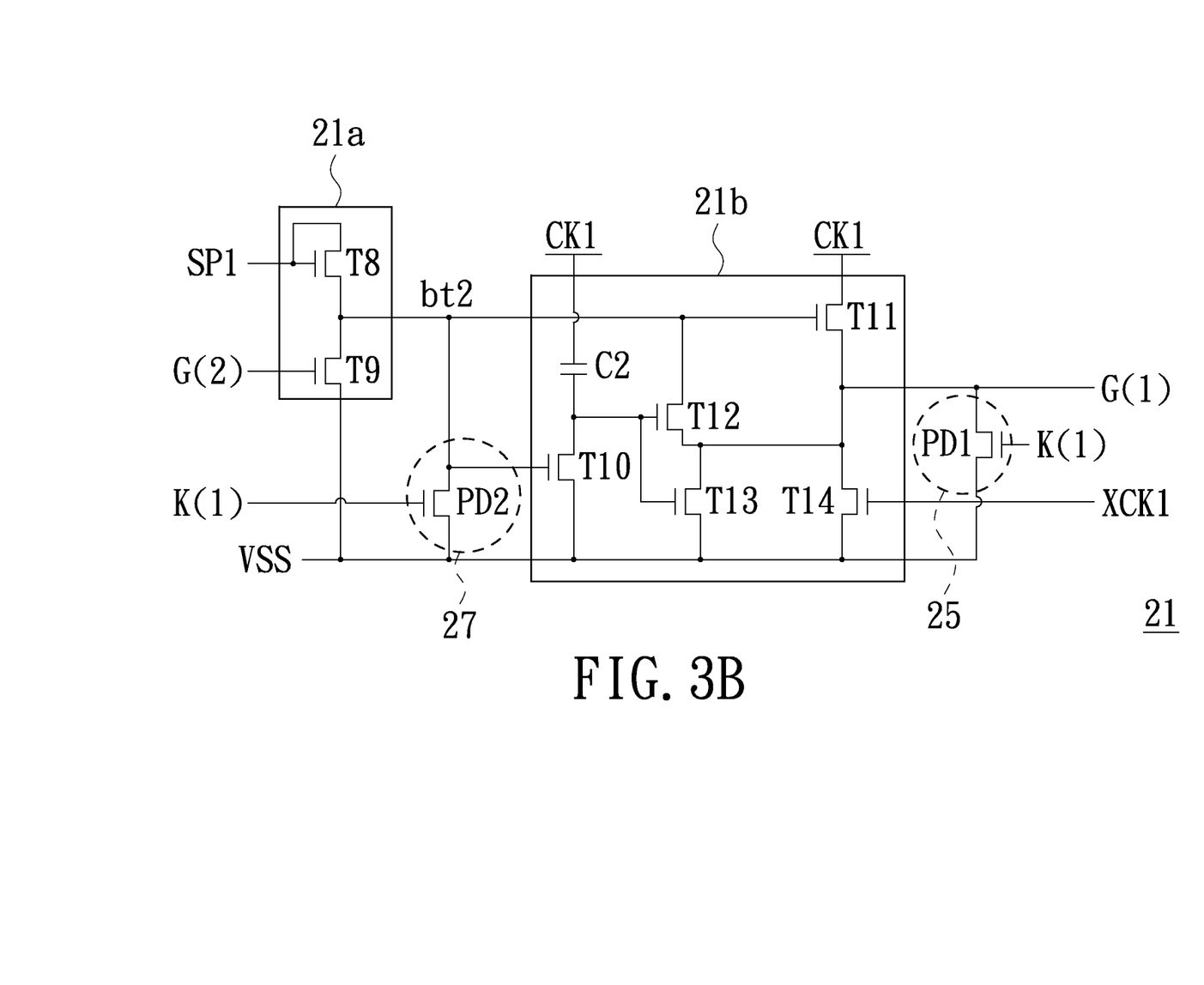

FIGS. 3A, 3B are schematic in-detailed circuit views of the first stage of first shift register 11 and the first stage of second shift register 21 shown in FIG. 1 in accordance with a first embodiment of the present disclosure, respectively. As shown in FIG. 3A, the first stage of first shift register 11 includes an input unit 11a and an output unit 11b, both are electrically connected to a connection node bt1. The input unit 11a is configured to receive the start signal SP2 and the second-stage control signal K(2) which is outputted from the second stage of first shift register 13. The output unit 11b is configured to receive the clock signal CK2, the complementary clock signal XCK2 and output the first-stage control signal K(1) according to the voltage level at the connection node bt1.

The input unit 11a includes transistors T1 and T2. Specifically, the transistor T1 has a first end, a control end and a second end. The transistor T1 is configured to have the first end thereof electrically connected to the control end thereof; the control end thereof for receiving the start signal SP2; and the second end thereof electrically connected to the connection node bt1. The transistor T2 has a first end, a control end and a second end. The transistor T2 is configured to have the first end thereof electrically connected to the second end of the transistor T1; the control end thereof for receiving the second-stage control signal K(2); and the second end thereof for receiving a voltage source VSS.

The output unit 11b includes a capacitor C1 and transistors T3~T7. Specifically, the capacitor C1 has a first end and a second end. The capacitor C1 is configured to have the first end thereof for receiving the clock signal CK2. The transistor T3 has a first end, a control end and a second end. The transistor T3 is configured to have the first end thereof electrically connected to the second end of the capacitor C1; the control end thereof electrically connected to the connection node bt1; and the second end thereof for receiving the voltage source VSS. The transistor T4 has a first end, a control end and a second end. The transistor T4 is configured to have the first end thereof for receiving the clock signal CK2; the control end thereof electrically connected to the connection node bt1; and the second end thereof for outputting the first-stage control signal K(1).

As shown in FIG. 3A, the transistor T5 has a first end, a control end and a second end. The transistor T5 is configured to have the first end thereof electrically connected to the control end of the transistor T4; the control end thereof electrically connected to the first end of the transistor T3; and the second end thereof electrically connected to the second end of the transistor T4. The transistor T6 has a first end, a control end and a second end. The transistor T6 is configured to have the first end thereof electrically connected to the second end of the transistor T5; the control end thereof electrically connected to the control end of the transistor T5; and the second end thereof for receiving the voltage source VSS. The transistor T7 has a first end, a control end and a second end. The transistor T7 is configured to have the first end thereof electrically connected to the first end of the transistor T6; the control end thereof for receiving the complementary clock signal XCK2; and the second end thereof for receiving the voltage source VSS.

As shown in FIG. 3B, the first stage of second shift register 21 includes an input unit 21a and an output unit 21b, both are electrically connected to a connection node bt2. The input unit 21a is configured to receive the start signal SP1 and the second-stage scan signal G(2) which is outputted from the second stage of second shift register 23. The output unit 21b is configured to receive the clock signal CK1 and the complementary clock signal XCK1 and output the first-stage scan signal G(1) according to the voltage level at the connection node bt2.

The input unit 21a includes transistors T8 and T9. Specifically, the transistor T8 has a first end, a control end and a second end. The transistor T8 is configured to have the first end thereof electrically connected to the control end thereof; the control end thereof for receiving the start signal SP1; and the second end thereof electrically connected to the connection node bt2. The transistor T9 has a first end, a control end and a second end. The transistor T9 is configured to have the first end thereof electrically connected to the second end of the transistor T8; the control end thereof for receiving the second-stage scan signal G(2); and the second end thereof for receiving the voltage source VSS.

As shown in FIG. 3B, the output unit 21b includes a capacitor C2 and transistors T10~T14. Specifically, the capacitor C2 has a first end and a second end. The capacitor C2 is configured to have the first end thereof for receiving the clock signal CK1. The transistor T10 has a first end, a control end and a second end. The transistor T10 is configured to have the first end thereof electrically connected to the second end of the capacitor C2; the control end thereof electrically connected to the connection node bt2; and the second end thereof for receiving the voltage source VSS. The transistor T11 (also referred as an output transistor) has a first end, a control end and a second end. The transistor T11 is configured to have the first end thereof for receiving the clock signal CK1; the control end thereof electrically connected to the connection node bt2; and the second end thereof for outputting the first-stage scan signal G(1).

As shown in FIG. 3B, the transistor T12 has a first end, a control end and a second end. The transistor T12 is configured to have the first end thereof electrically connected to the control end of the transistor T11; the control end thereof electrically connected to the first end of the transistor T10; and the second end thereof electrically connected to the second end of the transistor T11. The transistor T13 has a first end, a control end and a second end. The transistor T13 is configured to have the first end thereof electrically connected to the second end of the transistor T12; the control end thereof electrically connected to the control end of the transistor T12; and the second end thereof for receiving the voltage source VSS. The transistor T14 has a first end, a control end and a second end. The transistor T14 is configured to have the first end thereof electrically connected to the first end of the transistor T13; the control end thereof for receiving the complementary clock signal XCK1; and the second end thereof for receiving the voltage source VSS.

In addition, as shown in FIG. 3B, the first pull-down unit 25 is electrically connected to the output unit 21b and configured to receive the first-stage control signal K(1). Specifically, the first pull-down unit 25 includes a pull-down transistor PD1. The pull-down transistor PD1 has a first end, a control end and a second end. The pull-down transistor PD1 is configured to have the first end thereof electrically connected to the second end of the transistor T11; the control terminal thereof for receiving the first-stage control signal K(1); and the second end thereof for receiving the voltage source VSS.

The second pull-down unit 27 is electrically connected to the connection node bt2 and configured to receive the first-stage control signal K(1). Specifically, the second pull-down unit 27 includes a pull-down transistor PD2. The pull-down transistor PD2 has a first end, a control end and a second end. The pull-down transistor PD2 is configured to have the first end thereof electrically connected to the connection node bt2; the control terminal thereof for receiving the first-stage control signal K(1); and the second end thereof for receiving the voltage source VSS. In addition, the transistors T1~T14 and the pull-down transistors PD1, PD2 each can be implemented by either a field effect transistor or a bipolar transistors, and preferably are implemented by a P-type or N-type thin film transistor in this embodiment.

One of the generation mean of the first pulse of the scan signal will be described in detail with reference of FIG. 3A, 3B. As shown, the first stage of first shift register 11 shown in FIG. 3A and the first stage of second shift register 21 shown in FIG. 3B have the similar circuit structure; and the main difference between the two is that the first-stage of second shift register 21 further includes the pull-down transistors PD1, PD2 for the implementation of the first pull-down unit 25 and the second pull-down unit 27, respectively. Please refer to FIGS. 2, 3A and 3B. In one frame period, the first stage of second shift register 21 and the first-stage of first shift register 11 are configured to generate the first pulse of the first-stage scan signal G(1) and the pulse of the first-stage control signal K(1) in response to the receiving of the first pulse of the start signal SP1 and the pulse of the start signal SP2, respectively.

Specifically, the first pull-down unit 25 and the second pull-down unit 27 are turned on in response to the receiving of the pulse of the first-stage control signal K(1) and thereby configuring the transistor T11 to have the control and second ends thereof electrically connected to the voltage source VSS when the first pulse of the first-stage scan signal G(1) is having a pulse width half to that of the second pulse. In other words, the first pulse of the first-stage scan signal G(1) is converted from a logic-high level into a logic-low level at the rising edge of the pulse of the first-stage control signal K(1). Therefore, the first-stage scan signal G(1) is shaped to have the first pulse having a pulse width half to that of the second pulse thereof. It is understood that the first pulse of each one of the scan signals can be generated based on the same manner; and no unnecessary detail is given here.

Figure 4A:
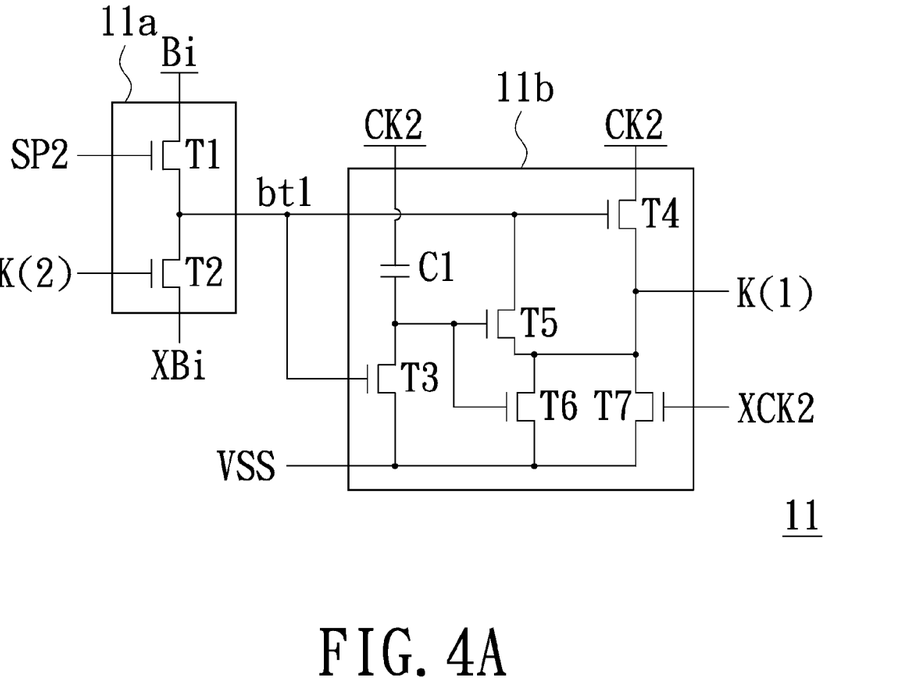
FIGS. 4A, 4B are schematic in-detailed circuit views of the first stage of first shift register and the first stage of second shift register shown in FIG. 1 in accordance with a second embodiment of the present disclosure, respectively.
Figure 4B:
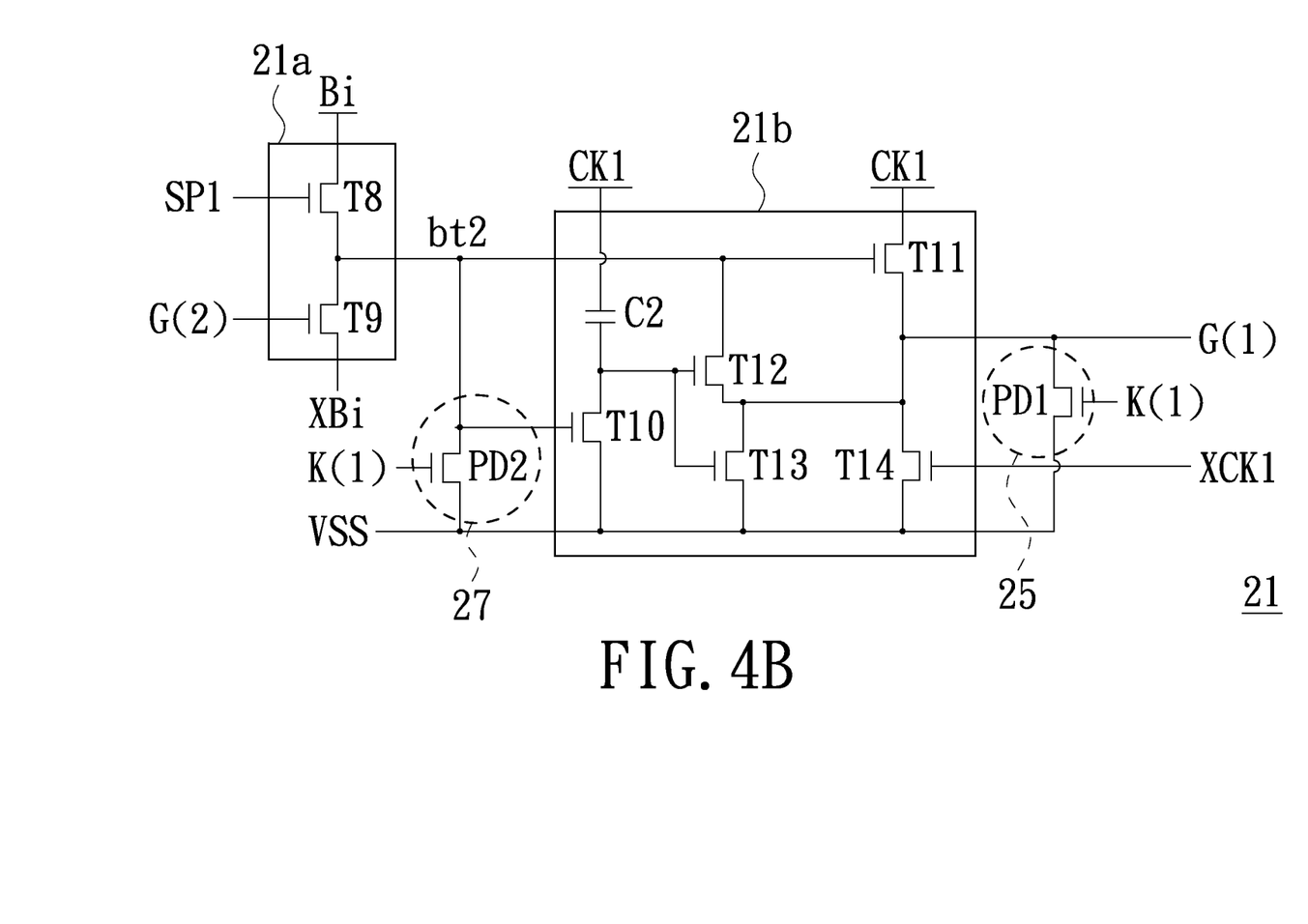

FIGS. 4A, 4B are schematic in-detailed circuit views of the first stage of first shift register 11 and the first stage of second shift register 21 shown in FIG. 1 in accordance with a second embodiment of the present disclosure, respectively; wherein the circuit structures shown in FIGS. 4A, 4B are adapted to used to a bi-directional shift register. As shown, the main difference between the first stage of first shift register 11 and the first stage of second shift register 21 in the second embodiment and that in the first embodiment is: the input units 11a, 21a in the second embodiment respectively shown in FIGS. 4A, 4B are further configured to be supplied with an input signal Bi and a complementary input signal Xbi; wherein it is to be noted that the input signals Bi, Xbi are not required to be complementary to each other in another embodiment. Because the first stage of first shift register 11 and the first stage of second shift register 21 in the second embodiment respectively shown in FIGS. 4A, 4B each have a circuit structure similar to that in the first embodiment respectively shown in FIGS. 3A, 3B, no unnecessary detail is given here.

As shown in FIG. 4A, the transistor T1 is configured to have the first end thereof for receiving the input signal Bi; the control end thereof for receiving the start signal SP2; and the second end thereof electrically connected to the connection node bt1. The transistor T2 is configured to have the first end thereof electrically connected to the second end of the transistor T1; the control end thereof for receiving the second-stage control signal K(2); and the second end thereof for receiving the complementary input signal XBi.

As shown in FIG. 4B, the transistor T8 is configured to have the first end thereof for receiving the input signal Bi; the control end thereof for receiving the start signal SP1; and the second end thereof electrically connected to the connection node bt2. The transistor T9 is configured to have the first end thereof electrically connected to the second end of the transistor T8; the control end thereof for receiving the second-stage scan signal G(2); and the second end thereof for receiving the complementary input signal XBi.

Figure 5A:
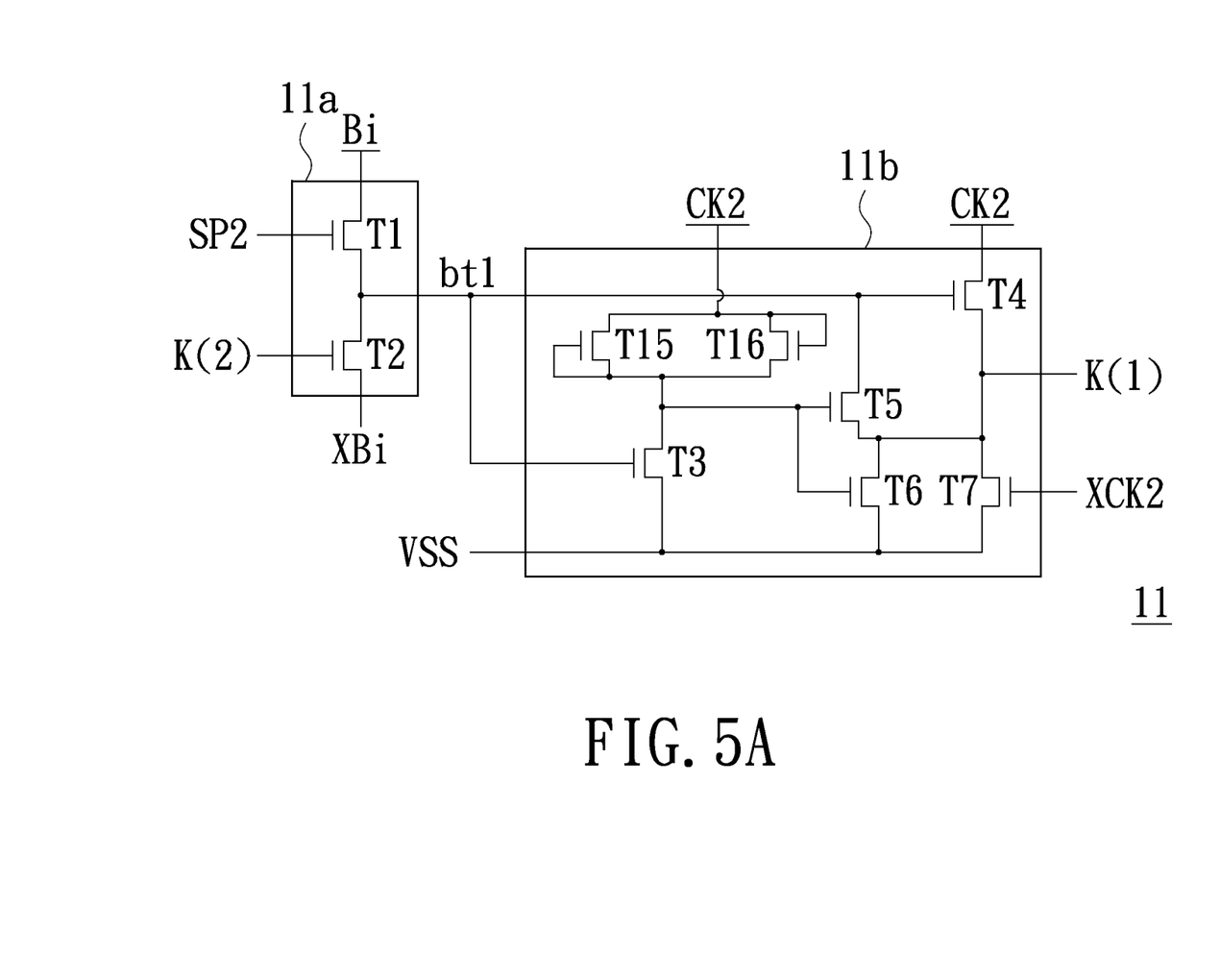
FIGS. 5A, 5B are schematic in-detailed circuit views of the first stage of first shift register and the first stage of second shift register shown in FIG. 1 in accordance with a third embodiment of the present disclosure, respectively.
Figure 5B:
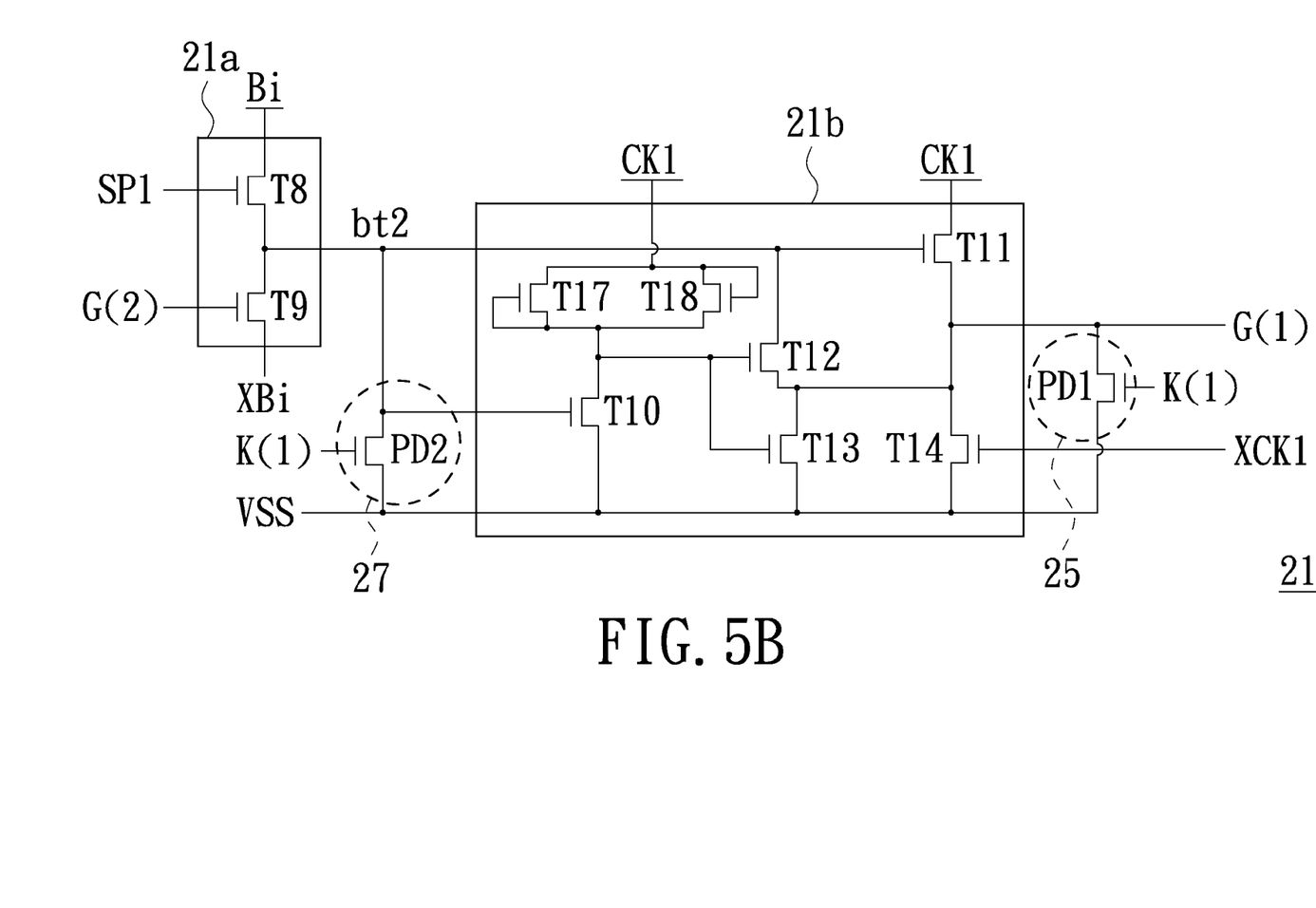

FIGS. 5A, 5B are schematic in-detailed circuit views of the first stage of first shift register 11 and the first stage of second shift register 21 shown in FIG. 1 in accordance with a third embodiment of the present disclosure, respectively. As shown, the main difference between the first stage of first shift register 11 and the first stage of second shift register 21 in the third embodiment and that in the first embodiment is: the capacitor C1 for the voltage regulation in the output unit 11b in the first embodiment is replaced by the diode-connected transistors T15, T16 in the third embodiment; and the capacitor C2 for the voltage regulation in the output unit 21b in the first embodiment is replaced by the diode-connected transistors T17, T18 in the third embodiment. Because the first stage of first shift register 11 and the first stage of second shift register 21 in the third embodiment respectively shown in FIGS. 5A, 5B each have a circuit structure similar to that in the first embodiment respectively shown in FIGS. 3A, 3B, no unnecessary detail is given here.

As shown in FIG. 5A, the transistor T15 is configured to have the first end thereof for receiving the clock signal CK2; and the control and second ends thereof electrically connected to the first end of the transistor T3. The transistor T16 is configured to have the first end thereof for receiving the clock signal CK2; the control end thereof electrically connected to the first end thereof; and the second end thereof electrically connected to the first end of the transistor T3.

As shown in FIG. 5B, the transistor T17 is configured to have the first end thereof for receiving the clock signal CK1; and the control and second ends thereof electrically connected to the first end of the transistor T10. The transistor T18 is configured to have the first end thereof for receiving the clock signal CK1; the control end thereof electrically connected to the first end thereof; and the second end thereof electrically connected to the first end of the transistor T10.

According to the circuit structures shown in FIGS. 3A, 3B, 4A, 4B, 5A and 5B, to those ordinarily skilled in the art it is understood that the first stage of first shift register 11 shown in FIGS. 3A, 4A and 5A has a circuit structure corresponding to that of the first stage of second shift register 21 shown in FIGS. 3B, 4B and 5B, respectively. In addition, and the main difference between each two of the first stage of first shift registers as well as each two of the first stage of second shift registers is the associated input and output signals, as exemplarily illustrated in FIG. 7.

Figure 6:
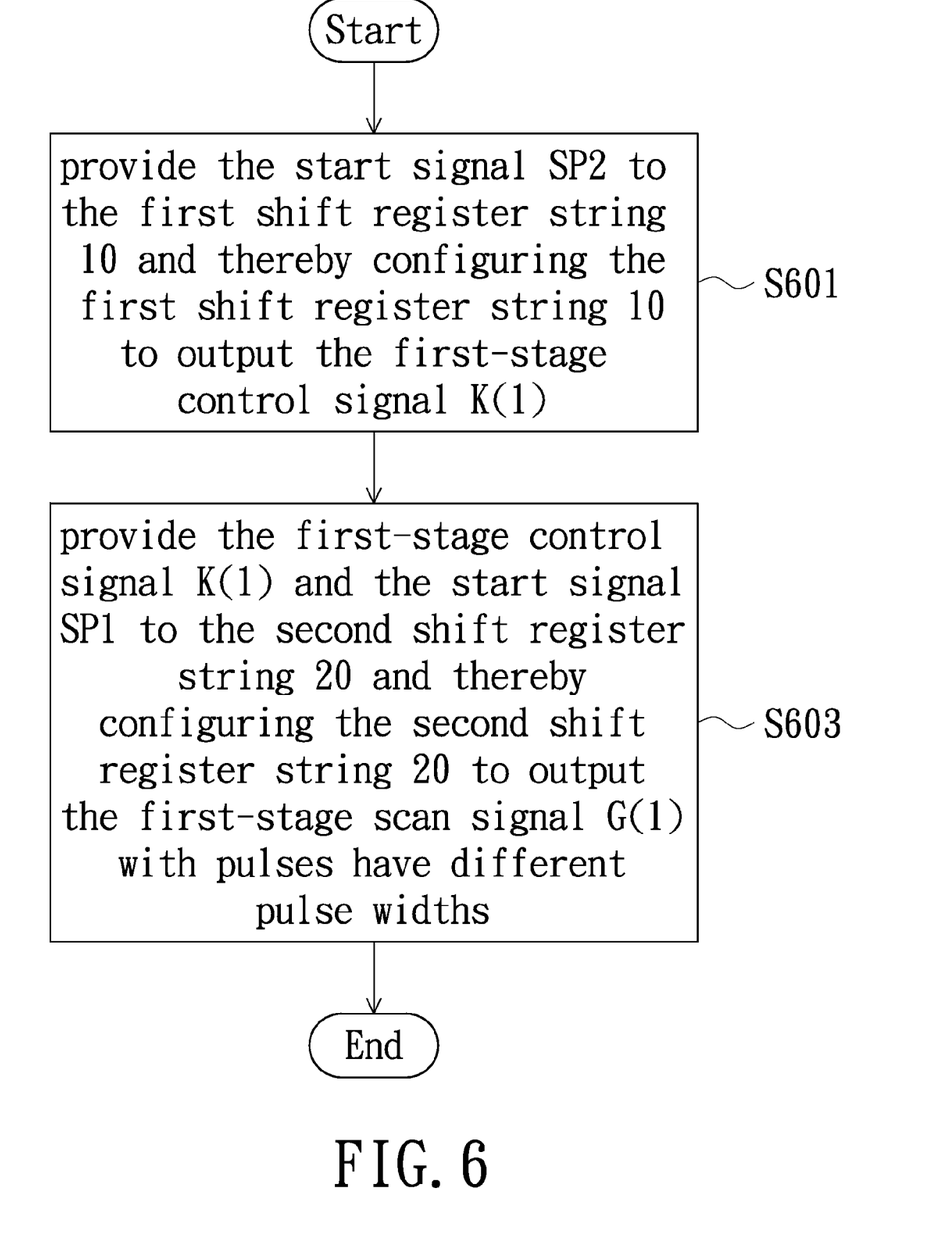
FIG. 6 is a schematic flowchart illustrating a driving method of a shift register circuit in accordance with an embodiment of the present disclosure.

FIG. 6 is a schematic flowchart illustrating a driving method of the shift register circuit 100 shown in FIG. 1 in accordance with an embodiment of the present disclosure. Please refer the FIGS. 1 and 6 both. In step S601, the first shift register string 10 is supplied with the start signal SP2 and thereby being configured to output the first-stage control signal K(1).

Next, in step S603, the second shift register string 20 is supplied with the first-stage control signal K(1) and the start signal SP1 and thereby being configured to output the first pulse of the first-stage scan signal G(1) accordingly; then, the second shift register string 20 outputs the second pulse of the first-stage scan signal G(1) according to the start signal SP1. Specifically, the first and second pulses are configured to have a pulse width different to each other; and specifically, the first pulse is configured to have a width half to that of the second pulse.

Figure 7:
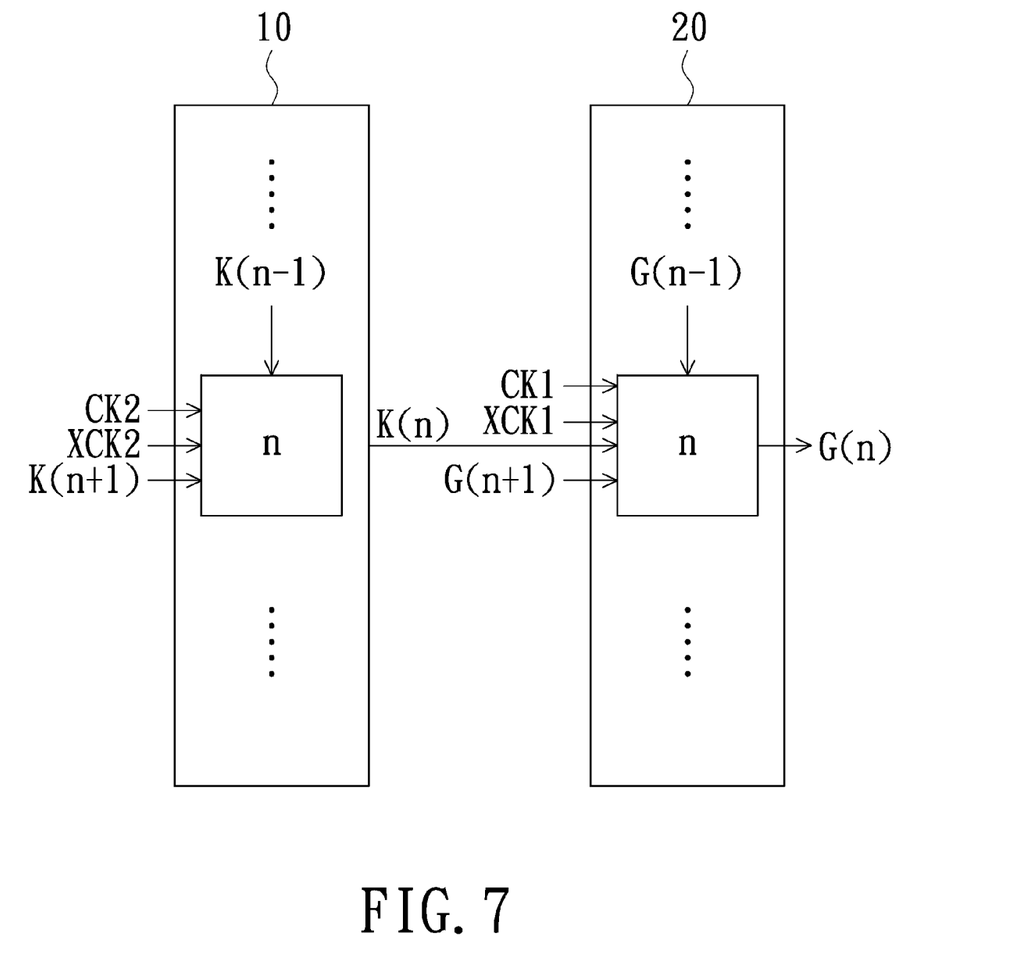
FIG. 7 is a schematic view illustrating a signal connection between a first shift register (except the first stage of first shift register) in the first shift register string and a respective second shift register (except the first stage of second shift register) in the second shift register string.

According to the aforementioned description, to those ordinarily skilled in the art it is understood that the first shift registers (except the first stage of first shift register 11) each in the first shift register string 10 and the second shift registers (except the first-stage second shift register 21) each in the second shift register string 20 can be summarized to have a signal connection as illustrated in FIG. 7.

FIG. 7 is a schematic view illustrating a signal connection between a first shift register (except the first stage of first shift register 11) in the first shift register string 10 and a respective second shift register (except the first stage of second shift register 21) in the second shift register string 20; wherein the signal connection herein is exemplified by between the $n_{th}$ stage of first shift register in the first shift register string 10 and the respective $n_{th}$ stage of second shift register in the second shift register string 20. As shown, the $n_{th}$ stage of first shift register in the first shift register string 10 is configured to receive the clock signal CK2, the complementary clock signal XCK2, the control signal K(n+1) outputted from the $(n+1)_{th}$ stage of first shift register, the control signal K(n−1) outputted from the $(n-1)_{th}$ stage of first shift register and accordingly output the $n_{th}$-stage control signal K(n). The $n_{th}$ stage of second shift register in the second shift register string 20 is configured to receive the clock signal CK1, the complementary clock signal XCK1, the control signal K(n) outputted from the $n_{th}$ stage of first shift register, the scan signal G(n+1) outputted from the $(n+1)_{th}$ stage of second shift register, the scan signal G(n−1) outputted from the $(n-1)_{th}$ stage of second shift register and accordingly output the $n_{th}$-stage scan signal G(n). In addition, to those ordinarily skilled in the art it is understood that the first shift register string 10 and the second shift register string 20 may further include at least one redundant shift register electrically connected to the last stage of first and second shift registers therein, respectively, for providing a feedback signal.

Figure 8:
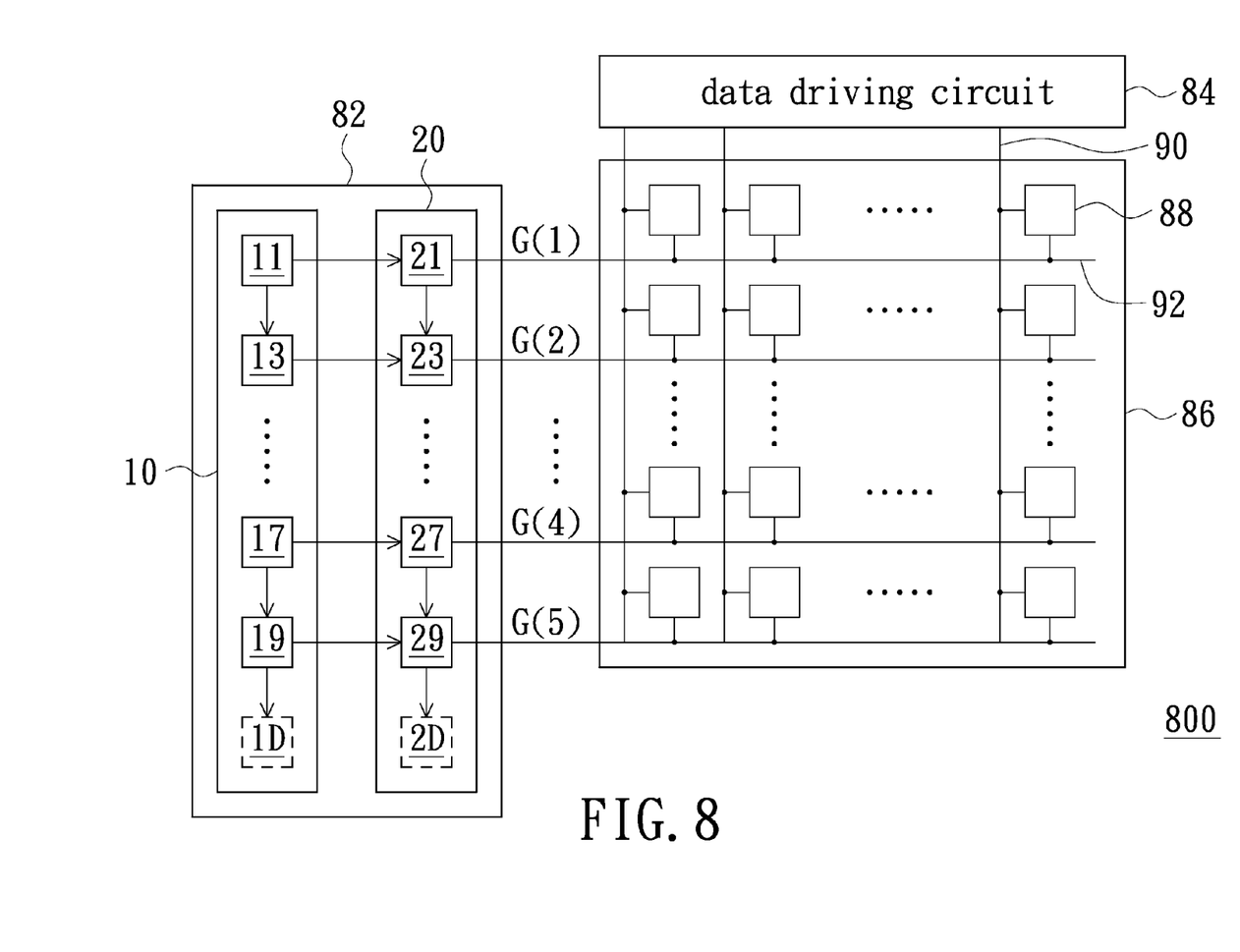
FIG. 8 is a schematic view of a display apparatus employing the shift register circuit of the present disclosure.

FIG. 8 is a schematic view of a display apparatus employing the shift register circuit of the present disclosure. As shown, the display apparatus 800 includes a shift register circuit 82, a data driving circuit 84 and a display panel 86. The display panel 86 includes a plurality of pixels 88, a plurality of data lines 90 and a plurality of scan lines 92. The data driving circuit 84 is electrically connected to the data lines 90; and the shift register circuit 82 is electrically connected to the scan lines 92. The shift register circuit 82 includes the first shift register string 10 and the second shift register string 20. The first shift register string 10 includes a plurality of stages of first shift register; wherein the first shift register string 10 herein is exemplified by including six stages of first shift register (i.e., the first stage of first shift register 11, the second stage of first shift register 13, . . . , the fifth stage of first shift register 19 and the sixth stage of first shift register 1D). The second shift register string 20 includes a plurality of stages of second shift register; wherein the second shift register string 20 herein is exemplified by including six stages of second shift register (i.e., the first stage of second shift register 21, the second stage of second shift register 23, . . . , the fifth stage of second shift register 29 and the sixth stage of second shift register 2D). The first shift register 1D and the second shift register 2D both are a redundant shift register; and accordingly it is understood that only the first five stages of second shift registers 21~29 in the second shift register string 20 are configured to output the scan signals G(1)~G(5), respectively. It is to be noted that the first shift register 1D and the second shift register 2D may have no dummy in another embodiment.

As shown in FIG. 8, the scan signals G(1)~G(5) each are configured to provide two pulses from the shift register circuit 82 in one frame period; wherein the first pulse in each one frame period is used for the pre-charging operation. Take the scan signals G(1) and G(2) in FIG. 8 as an example and please also reference with FIG. 2. After the scan signal G(1) writing voltages to the pixels 88 electrically connected thereto by the second pulse thereof in the first frame period, consequently the scan signal G(2) writes voltages to the pixels 88 electrically connected thereto by the second pulse thereof in the same first frame period. Because the pixels 88 electrically connected to the scan signal G(1) already have been updated in the first frame period while the pixels 88 electrically connected to the scan signal G(2) are being updated by the second pulse of the scan signal G(2), the pixel update performed by the scan signal G(2) may result in a voltage coupling effect on the pixels 88 electrically coupled to the scan signal G(1); in other words, due to the pixels 88 electrically coupled to the scan signal G(1) are already done with the write operation in the first frame period, the voltage coupling resulted from the write operation of the scan signal G(2) on the electrically-coupled pixels 88 may lead to a declining picture quality on the display panel 86. However, in this present embodiment, due to the scan signal G(2) is configured to perform the pre-charging operation on the pixels 88 electrically coupled thereto by the first pulse thereof in the same first frame period, these electrically-coupled pixels 88 can have less voltage variation while being updated by the second pulse of the scan signal G(2); thus, the voltage coupling effect resulted from the second pulse in the first frame period is reduced consequently.

In summary, through configuring the scan signal to have a first pulse and a second pulse in one frame period and using the first period to perform the pre-charging operation on the electrically-connected pixels before these electrically-connected pixels are being updated by the second pulse, these electrically-connected pixels can have a narrowed down potential difference so as to avoid the voltage coupling effect on the pixels already have been charged; thus, the abnormal display image (such as low brightness uniformity along a vertical line) occurring in the prior art is avoided, consequently. Specifically, because having a narrowed down voltage variation, these pixels have been performed by the pre-charging operation can have lower voltage coupling effect on other pixels while being updated; and accordingly the display images can have a brightness with higher uniformity.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register circuit, comprising:
a first shift register string configured to receive a first start signal and output a first-stage control signal; and
a second shift register string, electrically connected to the first shift register string, configured to receive the first-stage control signal, a second start signal and output the first pulse of a first-stage scan signal according to the first-stage control signal and the second start signal and consequently output the second pulse of the first-stage scan signal according to the second start signal, wherein the first and second pulses are configured to have different pulse widths.

2. The shift register circuit according to claim 1, wherein the first pulse of the first-stage scan signal is configured to be converted from a logic-high level into a logic-low level at the rising edge of the first-stage control signal.

3. The shift register circuit according to claim 2, wherein the second shift register string comprises a first stage of second shift register, the first stage of second shift register comprises:
an output transistor comprising a first end, a control end and a second end;
an output end electrically connected to the second end of the output transistor and configured to output the first and second pulses of the first-stage scan signal;
a first pull-down unit, electrically connected to the output end, configured to receive the first-stage control signal and pull down the voltage level at the output end at the rising edge of the first-stage control signal; and
a second pull-down unit, electrically connected to the control end of the output transistor, configured to receive the first-stage control signal and pull down the voltage level at the output end at the rising edge of the first-stage control signal.

4. The shift register circuit according to claim 1, wherein the first shift register string comprises a first stage of first shift register and a second stage of first shift register, the second shift register string comprises a first stage of second shift register and a second stage of second shift register, the first stage of first shift register is configured to receive the first start signal and output the first-stage control signal to both of the first stage of second shift register and the second stage of first shift register, the second stage of first shift register is configured to the receive first-stage control signal and output a second-stage control signal to the second stage of second shift register.

5. The shift register circuit according to claim 4,
wherein the first stage of first shift register comprises:
a first input unit configured to receive the first start signal and the second-stage control signal outputted from the second stage of first shift register;

a first connection node; and a first output unit electrically connected to the first connection node and configured to receive a first clock signal, a complementary first clock signal and output the first-stage control signal according to the voltage level at the first connection node;

wherein the first stage of second shift register comprises:

a second input unit configured to receive the second start signal and a second-stage scan signal outputted from the second stage of second shift register;

a second connection node;

a second output unit electrically connected to the second connection node and configured to receive a second clock signal, a complementary second clock signal and output the first-stage scan signal according to the voltage level at the second connection node;

a first pull-down unit electrically connected to the second output unit and configured to receive the first-stage control signal; and a second pull-down unit electrically connected to the second connection node and configured to receive the first-stage control signal.

6. The shift register circuit according to claim 5, wherein the first input unit comprises:

a first transistors comprising a first end, a control end and a second end, the first transistor being configured to have the first end thereof electrically connected to the control end thereof, the control end thereof for receiving the first start signal, and the second end thereof electrically connected to the first connection node; and a second transistor comprising a first end, a control end and a second end, the second transistor being configured to have the first end thereof electrically connected to the second end of the first transistor, the control end thereof for receiving the second-stage control signal, and the second end thereof for receiving a voltage source.

7. The shift register circuit according to claim 6, wherein the first output unit comprises:

a first capacitor comprising a first end and a second end, the first capacitor being configured to have the first end thereof for receiving the first clock signal;

a third transistor comprising a first end, a control end and a second end, the third transistor being configured to have the first end thereof electrically connected to the second end of the first capacitor, the control end thereof electrically connected to the first connection node, and the second end thereof for receiving the voltage source;

a fourth transistor comprising a first end, a control end and a second end, the fourth transistor being configured to have the first end thereof for receiving the first clock signal, the control end thereof electrically connected to the first connection node, and the second end thereof for outputting the first-stage control signal;

a fifth transistor comprising a first end, a control end and a second end, the fifth transistor being configured to have the first end thereof electrically connected to the control end of the fourth transistor, the control end thereof electrically connected to the first end of the third transistor, and the second end thereof electrically connected to the second end of the fourth transistor;

a sixth transistor comprising a first end, a control end and a second end, the sixth transistor being configured to have the first end thereof electrically connected to the second end of the fifth transistor, the control end thereof electrically connected to the control end of the fifth transistor, and the second end thereof for receiving the voltage source; and a seventh transistor comprising a first end, a control end and a second end, the seventh transistor being configured to have the first end thereof electrically connected to the first end of the sixth transistor, the control end thereof for receiving the complementary first clock signal, and the second end thereof for receiving the voltage source.

8. The shift register circuit according to claim 7, wherein the second input unit comprises:

an eighth transistor comprising a first end, a control end and a second end, the eighth transistor being configured to have the first end thereof electrically connected to the control end thereof, the control end thereof for receiving the second start signal, and the second end thereof electrically connected to the second connection node; and a ninth transistor comprising a first end, a control end and a second end, the ninth transistor being configured to have the first end thereof electrically connected to the second end of the eighth transistor, the control end thereof for receiving the second-stage scan signal, and the second end thereof for receiving the voltage source.

9. The shift register circuit according to claim 8, wherein the second output unit comprises:

a second capacitor comprising a first end and a second end, the second capacitor being configured to have the first end thereof for receiving the second clock signal;

a tenth transistor comprising a first end, a control end and a second end, the tenth transistor being configured to have the first end thereof electrically connected to the second end of the second capacitor, the control end thereof electrically connected to the second connection node, and the second end thereof for receiving the voltage source;

an eleventh transistor comprising a first end, a control end and a second end, the eleventh transistor being configured to have the first end thereof for receiving the second clock signal, the control end thereof electrically connected to the second connection node, and the second end thereof for outputting the first-stage scan signal;

a twelfth transistor comprising a first end, a control end and a second end, the twelfth transistor being configured to have the first end thereof electrically connected to the control end of the eleventh transistor, the control end thereof electrically connected to the first end of the tenth transistor, and the second end thereof electrically connected to the second end of the eleventh transistor;

a thirteenth transistor comprising a first end, a control end and a second end, the thirteen transistor being configured to have the first end thereof electrically connected to the second end of the twelfth transistor, the control end thereof electrically connected to the control end of the twelfth transistor, and the second end thereof for receiving the voltage source; and a fourteenth transistor comprising a first end, a control end and a second end, the fourteenth transistor being configured to have the first end thereof electrically connected to the first end of the thirteenth transistor, the control end thereof for receiving the complementary second clock signal, and the second end thereof for receiving the voltage source.

10. The shift register circuit according to claim 4, wherein the first stage of second shift register comprises:

a second input unit configured to receive the second start signal and a second-stage scan signal outputted from the second stage of second shift register;

a second connection node;

a second output unit electrically connected to the second connection node and configured to receive a second clock signal, a complementary second clock signal and output the first-stage scan signal according to the voltage level at the second connection node;

a first pull-down unit electrically connected to the second output unit and configured to receive the first-stage control signal; and a second pull-down unit electrically connected to the second connection node and configured to receive the first-stage control signal.

11. The shift register circuit according to claim 10, wherein the second input unit comprises:

an eighth transistor comprising a first end, a control end and a second end, the eighth transistor being configured to have the first end thereof electrically connected to the control end thereof, the control end thereof for receiving the second start signal, and the second end thereof electrically connected to the second connection node; and a ninth transistor comprising a first end, a control end and a second end, the ninth transistor being configured to have the first end thereof electrically connected to the second end of the eighth transistor, the control end thereof for receiving the second-stage scan signal, and the second end thereof for receiving the voltage source.

12. The shift register circuit according to claim 11, wherein the second output unit comprises:

a second capacitor comprising a first end and a second end, the second capacitor being configured to have the first end thereof for receiving the second clock signal;

a tenth transistor comprising a first end, a control end and a second end, the tenth transistor being configured to have the first end thereof electrically connected to the second end of the second capacitor, the control end thereof electrically connected to the second connection node, and the second end thereof for receiving the voltage source;

an eleventh transistor comprising a first end, a control end and a second end, the eleventh transistor being configured to have the first end thereof for receiving the second clock signal, the control end thereof electrically connected to the second connection node, and the second end thereof for outputting the first-stage scan signal;

a twelfth transistor comprising a first end, a control end and a second end, the twelfth transistor being configured to have the first end thereof electrically connected to the control end of the eleventh transistor, the control end thereof electrically connected to the first end of the tenth transistor, and the second end thereof electrically connected to the second end of the eleventh transistor;

a thirteenth transistor comprising a first end, a control end and a second end, the thirteen transistor being configured to have the first end thereof electrically connected to the second end of the twelfth transistor, the control end thereof electrically connected to the control end of the twelfth transistor, and the second end thereof for receiving the voltage source; and a fourteenth transistor comprising a first end, a control end and a second end, the fourteenth transistor being configured to have the first end thereof electrically connected to the first end of the thirteenth transistor, the control end thereof for receiving the complementary second clock signal, and the second end thereof for receiving the voltage source.

13. The shift register circuit according to claim 12, wherein the first pull-down unit comprises:

a first pull-down transistor comprising a first end, a control end and a second end, the first pull-down transistor being configured to have the first end thereof electrically connected to the second end of the eleventh transistor, the control end thereof for receiving the first-stage control signal, and the second end thereof for receiving the voltage source.

14. The shift register circuit according to claim 13, wherein the second pull-down unit comprises:

a second pull-down transistor comprising a first end, a control end and a second end, the second pull-down transistor being configured to have the first end thereof electrically connected to the second connection node, the control end thereof for receiving the first-stage control signal, and the second end thereof for receiving the voltage source.

15. A driving method of a shift register circuit, the shift register circuit comprising a first shift register string and a second shift register string, the driving method comprising:

providing a first start signal to the first shift register string and thereby configuring the first shift register string to output a first-stage control signal; and providing the first-stage control signal and a second start signal to the second shift register string and thereby configuring the second shift register string to output the first pulse of a first-stage scan signal according to the first-stage control signal and the second start signal and consequently output the second pulse of the first-stage scan signal according to the second start signal, wherein the first and second pulses are configured to have different pulse widths.

16. The driving method of a shift register circuit according to claim 15, wherein the first pulse of the first-stage scan signal is configured to be converted from a logic-high level into a logic-low level at the rising edge of the first-stage control signal.

17. The driving method of a shift register circuit according to claim 16, wherein providing the first-stage control signal and a second start signal to the second shift register string and thereby configuring the second shift register string to output the first pulse of a first-stage scan signal according to the first-stage control signal and the second start signal and consequently output the second pulse of the first-stage scan signal according to the second start signal further comprises:

enabling, by the first-stage control signal, a first pull-down unit and a second pull-down unit in the second shift register string and thereby configuring the first pulse to have a pulse width half to that of the second pulse.

18. A shift register circuit configured to, according to the driving method disclosed in claim 16, output the scan signal with a first pulse and a second pulse having different pulse widths.

19. A shift register circuit, comprising:

a shift register string comprising a first pull-down unit and a second pull-down unit, the shift register string being configured to receive a control signal, a start signal and output the first pulse of a first-stage scan signal according to the control signal and the start signal and consequently output the second pulse of the first-stage scan signal according to the start signal, wherein the first and second pulses are configured to have different pulse widths.

20. The shift register circuit according to claim 19, wherein the first pulse is configured to have a pulse width half to that of the second pulse through enabling the first and second pull-down units by the control signal.

* * * * *